Sept. 7, 1965 A. L. HERRMANN 3,205,471

ELECTRICAL CONNECTOR FOR A PAIR OF CIRCUIT BOARDS

Filed Dec. 5, 1962

Adolf L. Herrmann,
*INVENTOR.*

BY S. J. Rotondi
A. T. Dupont
Jack W. Voigt

United States Patent Office 3,205,471 Patented Sept. 7, 1965

3,205,471
ELECTRICAL CONNECTOR FOR A PAIR OF CIRCUIT BOARDS

Adolf L. Herrmann, 710 Watts Drive NE., Huntsville, Ala.

Filed Dec. 5, 1962, Ser. No. 242,586
3 Claims. (Cl. 339—176)
(Granted under Title 35, U.S. Code (1952), sec. 266)

The invention described herein may be manufactured and used by or for the Government for governmental purposes without the payment of any royalty thereon.

This invention relates to printed circuit boards provided with pluralities of terminals disposed in corresponding pairs and more particularly to connectors for releasably joining the boards of an adjacent pair of the circuits and electrically connecting the corresponding pairs of terminals.

Conventional printed circuits include boards in which component parts of electronic equipment are compactly mounted thereon and connected in subassemblies for quick and easy replacement. The subassemblies are connected to terminals correspondingly spaced on edges of the boards and the boards are secured with the edges disposed in abutting relationship for respective electrical connection of pairs of the terminals.

The present invention is concerned primarily with the solution to the problem of joining printed circuit boards such that their connected ends are disposed in an offset relationship and that electrical connections are effected between the circuits on the boards. With the increased use of printed circuitry (a circuit layout printed on a thin board or sheet) and in view of the miniaturization of components of relatively large size, it is necessary that new forms and designs of connectors be devised to serve such needs. It has been found that in many instances electrical components such as resistors, capacitors, and similar components are so mounted on printed circuitry boards that offset mounting of such components is desirable.

The invention therefore comprises a connector for effecting such an offset electrical connection between such components mounted on printed circuit boards with a minimum amount of space utilization and at the same time making a highly effective electrical connection therebetween.

An object of the present invention is to provide an electrical connector for removably interconnecting such boards.

Another object of the present invention is to provide such a connector for securing adjacent removable boards and engaging corresponding terminal pairs to provide electrical continuity therebetween.

A further object of the present invention is to provide such a connector securing adjacent removable circuit boards in an offset relationship.

These and other objects of the present invention will become more fully apparent from the following explanation when taken in conjunction with the accompanying drawing of which:

Figure 1:
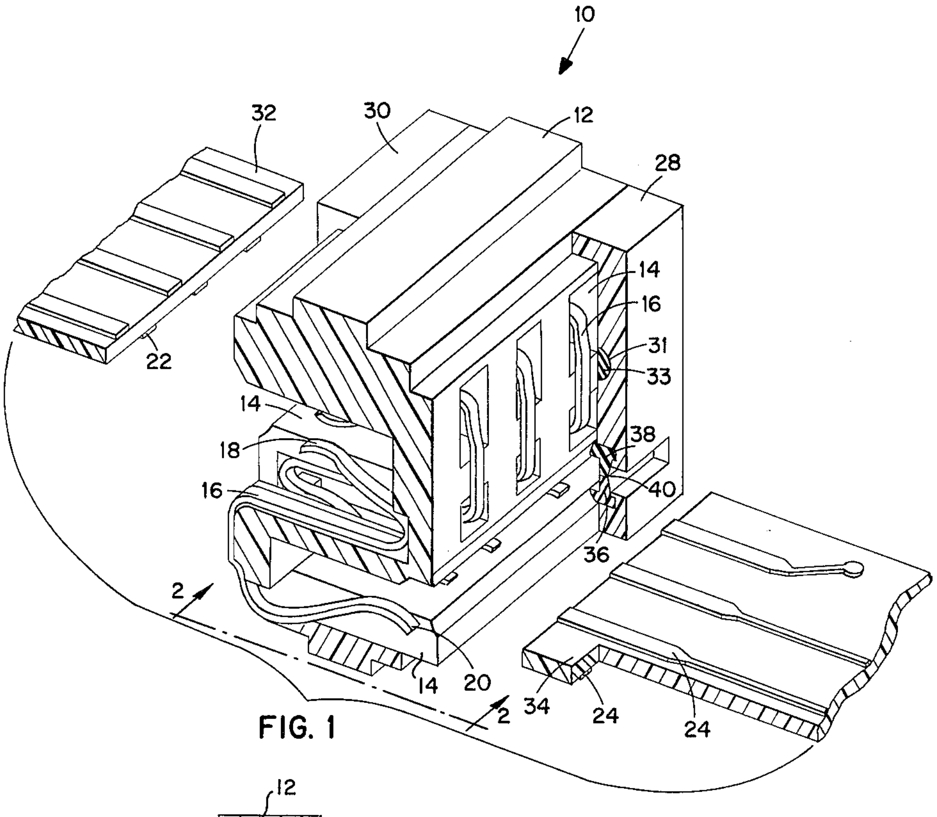
FIGURE 1 is a partially cut away exploded perspective view of the invention.
Figure 2:
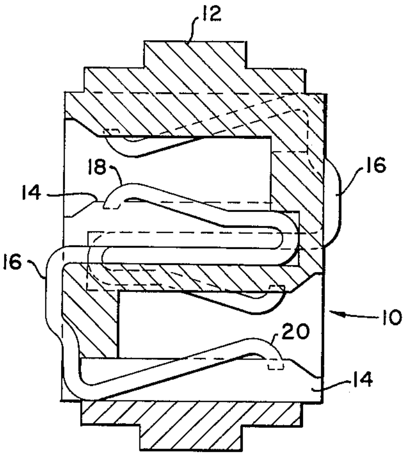
FIGURE 2 is a sectional view along line 2—2 of FIGURE 1 with the outer housing removed for clarity.

In the present invention, a connector 10 comprises an elongate mounting block 12 having a plurality of alternately oppositely disposed slots 14 therethrough which provide supports for a plurality of resilient clips 16 held therein. Clips 16 comprise generally S-shaped members disposed within slots 14 in an alternately opposed and inverted relationship. Electrical contact is provided at the upper and lower terminal ends 18 and 20 respectively of clips 16 with circuit conductors 22 and 24 respectively on the circuit boards 32 and 34.

Two separate generally elongate U-shaped housing members 28 and 30 closely abut against opposite sides of mounting block 12. Members 28 and 30 are alternately longitudinally slotted adjacent their upper and lower ends, respectively, to accommodate printed circuit boards 32 and 34. The broken away section of member 28 is sealably closed with rubber members 36 and 38 respectively. Members 36 and 38 are held by member 28 and have a longitudinal opening 40 therebetween and thus provide a sealing surface for circuit board 24 projecting therethrough. Member 30 is provided with a similar sealed opening (not shown).

Housing member 28 is provided on its inner surface with a transversely extending groove 31. After the housing has been assembled to the block 12, sealing material 33 is injected into groove 31 to provide a gas-tight seal between housing 28 and block 12. The housing 30 is similarly sealed to the block 12. The two seals between the housings and the block prevent gas from traveling from one board opening to the other.

The circuit board 32 is projected through opening 40 in member 36 and is held in resilient contact with terminal ends 20 of clips 16. The upper terminal ends 18 of clips 16 is similarly rigidly held in contact with circuit board 34 which is projected through the opening in member 38. By the above described operation, releasable electrical contact is made between the respective conductors 22 and 24 of boards 32 and 34 which are held in an offset relationship by connector 10.

Although the connector is designed primarily for circuit boards having conductors on both sides for maximum space-utilization, it is obvious that alternate clips may be removed from the connector and circuit boards having conductors on one side only may be used. The present invention is also adaptable for use with printed cable as well as printed circuit boards.

While the foregoing is a description of the preferred embodiment, the following claims are intended to include those modifications and variations that are within the spirit and scope of my invention.

The following invention is claimed:

1. An electrical connector comprising, an elongate mounting block of insulating material provided with opposing sides, said block provided with upper and lower laterally disposed slots in parallel vertically offset relation each of said slots opening into respective ones of said opposing sides, a plurality of spring contact members each respectively mounted in one of said slots and having a tip portion extending into the other said slot, said contact members being substantially S-shaped with one vertical leg substantially longer than the other vertical leg, alternate ones of said spring contact members being inverted both vertically and laterally with the center arm of the S substantially in alignment, and a pair of circuit boards having associated conductors thereon, said boards disposed for insertion and retention in said slots for electrical connection between said associated conductors on said circuit boards.

2. A connector as in claim 1 including an insulating housing disposed on said sides of said block for retention of said contacts in said block, said housing having a pair of laterally extending openings therein, each respectively disposed adjacent said slots.

3. An electrical connector as set forth in claim 2, wherein sealing means are provided adjacent the opening in each of said housings.

References Cited by the Examiner

UNITED STATES PATENTS

| | | | |
|---|---|---|---|
| 2,243,990 | 6/41 | Thorn et al. | 339—21 |
| 2,449,568 | 9/48 | Shirro et al. | 339—150 X |
| 2,765,450 | 10/56 | Richardson | 339—17 X |
| 2,925,537 | 2/60 | Winkler | 339—17 X |
| 2,971,179 | 2/61 | Heuer | 339—17 |
| 2,999,997 | 9/61 | Tuchel | 339—17 |
| 3,088,090 | 4/63 | Cole et al. | 339—94 X |
| 3,149,893 | 9/64 | Dupre | 339—17 X |

JOSEPH D. SEERS, *Primary Examiner.*